: US 10,065,288 B2
Sep. 4, 2018

(12) United States Patent
Wu et al.

(54) CHEMICAL MECHANICAL POLISHING (CMP) PLATFORM FOR LOCAL PROFILE CONTROL

(71) Applicant: Taiwan Semiconductor Manufacturing Co., Ltd., Hsin-Chu (TW)

(72) Inventors: Jiann Lih Wu, Hsin-Chu (TW); Chi-Ming Yang, Hsinchu (TW); James Jeng-Jyi Hwang, Chu-Tong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 157 days.

(21) Appl. No.: 14/829,995

(22) Filed: Aug. 19, 2015

(65) Prior Publication Data
US 2015/0352686 A1 Dec. 10, 2015

Related U.S. Application Data

(63) Continuation-in-part of application No. 13/372,872, filed on Feb. 14, 2012, now abandoned.

(51) Int. Cl.
*B24B 37/013* (2012.01)
*B24B 37/015* (2012.01)
(Continued)

(52) U.S. Cl.
CPC ............ *B24B 49/04* (2013.01); *B24B 37/013* (2013.01); *B24B 37/015* (2013.01);
(Continued)

(58) Field of Classification Search
CPC ... B24B 37/013; B24B 37/015; B24B 37/042; B24B 49/04; B24B 49/105; B24B 49/14;
(Continued)

(56) References Cited

U.S. PATENT DOCUMENTS 4,583,325 A * 4/1986 Tabuchi .................... B24B 7/16
15/4
5,605,488 A * 2/1997 Ohashi .................... B24B 37/30
451/259
(Continued)

FOREIGN PATENT DOCUMENTS

| JP | 2002-231672 | 8/2002 |
| KR | 100685744 B1 | 2/2007 |
| TW | 471993 B | 1/2002 |

OTHER PUBLICATIONS

White, et al. "What is Clean, Dry Air?" CAGI—Compressed Air and Gas Institute. Nov. 1, 2005.
(Continued)

*Primary Examiner* — Timothy V. Eley
*Assistant Examiner* — Arman Milanian
(74) *Attorney, Agent, or Firm* — Eschweiler & Potashnik, LLC

(57) ABSTRACT

A localized chemical mechanical polishing (CMP) platform is provided. A table is configured to support a workpiece with a to-be-polished surface. A polishing pad is spaced from the table with a width less than about half that of the table. The polishing pad is configured to individually polish rough regions of hillocks or valleys on the to-be-polished surface. A slurry distribution system is configured to apply slurry to an interface between the polishing pad and the workpiece. A cleaning system is configured to clean the workpiece in situ on the table. A drying system is configured to dry the workpiece in situ on the table. A method for CMP with local profile control and a system with local profile control are also provided.

20 Claims, 7 Drawing Sheets

(51) Int. Cl.

| | | |
|---|---|---|
| *B24B 49/04* | (2006.01) | |
| *B24B 49/14* | (2006.01) | |
| *H01L 21/306* | (2006.01) | |
| *H01L 21/66* | (2006.01) | |
| *H01L 21/67* | (2006.01) | |
| *B24B 49/10* | (2006.01) | |
| *B24B 37/04* | (2012.01) | |
| *B24B 37/10* | (2012.01) | |

(52) U.S. Cl.
CPC .......... *B24B 37/042* (2013.01); *B24B 37/105* (2013.01); *B24B 49/105* (2013.01); *B24B 49/14* (2013.01); *H01L 21/30625* (2013.01); *H01L 21/67075* (2013.01); *H01L 22/12* (2013.01); *H01L 22/26* (2013.01); *H01L 22/20* (2013.01)

(58) Field of Classification Search
CPC ......... H01L 21/30625; H01L 21/67075; H01L 22/12; H01L 22/20; H01L 22/26
See application file for complete search history.

(56) References Cited

U.S. PATENT DOCUMENTS

| | | | | |
|---|---|---|---|---|
| 5,658,183 | A * | 8/1997 | Sandhu | B23Q 15/013 250/559.27 |
| 5,762,751 | A * | 6/1998 | Bleck | H01L 21/67075 156/345.23 |
| 5,873,769 | A * | 2/1999 | Chiou | B24B 37/015 257/E21.23 |
| 5,951,373 | A * | 9/1999 | Shendon | B24B 37/32 451/285 |
| 6,012,967 | A * | 1/2000 | Satake | B24B 37/015 451/36 |
| 6,020,262 | A | 2/2000 | Wise et al. | |
| 6,063,301 | A | 5/2000 | Kiwada et al. | |
| 6,066,030 | A * | 5/2000 | Uzoh | B24B 37/046 451/287 |
| 6,077,151 | A | 6/2000 | Black et al. | |
| 6,077,783 | A | 6/2000 | Allman et al. | |
| 6,080,040 | A | 6/2000 | Appel et al. | |
| 6,123,609 | A | 9/2000 | Satou | |
| 6,135,858 | A * | 10/2000 | Takahashi | B24B 37/30 451/288 |
| 6,150,271 | A * | 11/2000 | Easter | B24B 37/30 257/E21.244 |
| 6,162,112 | A * | 12/2000 | Miyazaki | B24B 37/042 451/288 |
| 6,179,699 | B1 | 1/2001 | Costa | |
| 6,227,939 | B1 | 5/2001 | Monroe | |
| 6,299,506 | B2 | 10/2001 | Nishimura et al. | |
| 6,361,407 | B1 * | 3/2002 | Lu | C11D 11/0047 257/E21.23 |
| 6,368,198 | B1 | 4/2002 | Sung et al. | |
| 6,410,440 | B1 * | 6/2002 | Drill | B24B 37/042 257/E21.244 |
| 6,598,314 | B1 | 7/2003 | Kuo et al. | |
| 6,749,484 | B2 | 6/2004 | Yang et al. | |
| 6,764,387 | B1 * | 7/2004 | Chen | B24B 37/30 451/286 |
| 6,905,398 | B2 * | 6/2005 | Jeong | B24B 37/20 451/259 |
| 6,949,466 | B2 * | 9/2005 | Jeong | B24B 37/04 438/691 |
| 7,153,188 | B1 | 12/2006 | Zuniga et al. | |
| 7,198,055 | B2 | 4/2007 | Woods et al. | |
| 7,258,600 | B1 * | 8/2007 | Benner | B24B 53/00 257/E21.23 |
| 7,335,088 | B1 * | 2/2008 | Hwang | B24B 37/30 451/287 |
| 8,182,709 | B2 | 5/2012 | Heinrich et al. | |
| 2001/0029155 | A1 | 10/2001 | Bennett et al. | |
| 2001/0049252 | A1 | 12/2001 | Moore | |
| 2002/0098777 | A1 | 7/2002 | Laursen et al. | |
| 2002/0187728 | A1 | 12/2002 | Kiuchi et al. | |
| 2003/0008600 | A1 * | 1/2003 | Ide | B24B 37/013 451/41 |
| 2003/0114077 | A1 | 6/2003 | Yang et al. | |
| 2003/0119429 | A1 | 6/2003 | Bright et al. | |
| 2003/0181139 | A1 | 9/2003 | Lehman et al. | |
| 2003/0186624 | A1 * | 10/2003 | Koike | B24B 37/30 451/8 |
| 2004/0000328 | A1 | 1/2004 | Liu et al. | |
| 2004/0029333 | A1 | 2/2004 | Matsukawa et al. | |
| 2004/0038623 | A1 * | 2/2004 | Chandrasekaran | B24B 37/013 451/5 |
| 2004/0087248 | A1 | 5/2004 | Hirokawa | |
| 2004/0137829 | A1 * | 7/2004 | Park | B24B 1/005 451/41 |
| 2004/0219867 | A1 * | 11/2004 | Gotkis | B24B 37/013 451/41 |
| 2004/0242124 | A1 | 12/2004 | Bright et al. | |
| 2005/0048875 | A1 | 3/2005 | Koo et al. | |
| 2005/0173259 | A1 * | 8/2005 | Mavliev | B23H 5/08 205/645 |
| 2006/0040593 | A1 * | 2/2006 | Ikenaka | B24B 37/042 451/41 |
| 2006/0105678 | A1 * | 5/2006 | Kohama | B24B 37/04 451/5 |
| 2007/0004182 | A1 | 1/2007 | Chang et al. | |
| 2007/0072523 | A1 * | 3/2007 | Miyahara | B24B 29/02 451/290 |
| 2009/0061745 | A1 * | 3/2009 | Heinrich | B24B 37/24 451/289 |
| 2009/0170320 | A1 | 7/2009 | Heinrich et al. | |
| 2009/0233532 | A1 | 9/2009 | Togawa et al. | |
| 2010/0203806 | A1 * | 8/2010 | Kitakura | B24B 37/015 451/7 |
| 2010/0273396 | A1 | 10/2010 | Kobayashi et al. | |
| 2010/0291842 | A1 | 11/2010 | Chen et al. | |
| 2010/0314078 | A1 | 12/2010 | Lin et al. | |
| 2011/0124269 | A1 | 5/2011 | Tada et al. | |
| 2011/0130073 | A1 * | 6/2011 | Furukawa | B24B 37/042 451/6 |
| 2011/0159782 | A1 * | 6/2011 | Sone | B24B 37/015 451/7 |
| 2011/0189925 | A1 | 8/2011 | Iravani et al. | |
| 2012/0058709 | A1 * | 3/2012 | Fukushima | B24B 37/015 451/5 |
| 2012/0149198 | A1 | 6/2012 | Schwandner | |
| 2012/0190273 | A1 * | 7/2012 | Ono | B24B 37/015 451/5 |
| 2013/0122613 | A1 * | 5/2013 | Wang | H01L 22/12 438/14 |
| 2013/0210173 | A1 | 8/2013 | Wu et al. | |
| 2013/0210323 | A1 * | 8/2013 | Wu | B24B 53/017 451/56 |
| 2013/0217306 | A1 * | 8/2013 | Wu | B24B 49/16 451/9 |
| 2016/0101500 | A1 * | 4/2016 | Fung | B24B 37/015 156/345.12 |

OTHER PUBLICATIONS

U.S. Appl. No. 13/295,400, filed Nov. 14, 2011.
Non-Final Office Action dated Mar. 20, 2014 for U.S. Appl. No. 13/295,400.
Non-Final Office Action dated Jul. 7, 2014 for U.S. Appl. No. 13/295,400.
Final Office Action dated Dec. 18, 2014 for U.S. Appl. No. 13/295,400.
Non-Final Office Action dated May 1, 2015 for U.S. Appl. No. 13/295,400.
Srikanth Sundararajan, et al., "Two-Dimensional Wafer-Scale Chemical Mechanical Planarization Models Based on Lubrication Theory and Mass Transport", Journal of the Electrochemical Society, 146 (2) 761-766 (1999).
U.S. Appl. No. 13/372,872, filed Feb. 14, 2012.

(56) References Cited

OTHER PUBLICATIONS

Non-Final Office Action dated Aug. 14, 2014 for U.S. Appl. No. 13/372,872.
Final Office Action dated Mar. 20, 2015 for U.S. Appl. No. 13/372,872.
Notice of Allowance dated Apr. 18, 2016 U.S. Appl. No. 13/295,400.
Final Office Action dated Oct. 23, 2015 U.S. Appl. No. 13/295,400.

* cited by examiner

CHEMICAL MECHANICAL POLISHING (CMP) PLATFORM FOR LOCAL PROFILE CONTROL

RELATED APPLICATIONS

This application is a continuation-in-part of U.S. application Ser. No. 13/372,872, filed on Feb. 14, 2012. This application hereby incorporates by reference all subject matter of the U.S. Application.

BACKGROUND

During the manufacture of integrated circuits (ICs), multi-step sequences of semiconductor manufacturing processes are performed to gradually form electronic circuits on semiconductor substrates. One such semiconductor manufacturing process is chemical mechanical polishing (CMP). CMP is a process for smoothing or planarizing surfaces using a combination of chemical and mechanical forces. Among other things, CMP advantageously allows features of the electronic circuits to be more precisely formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
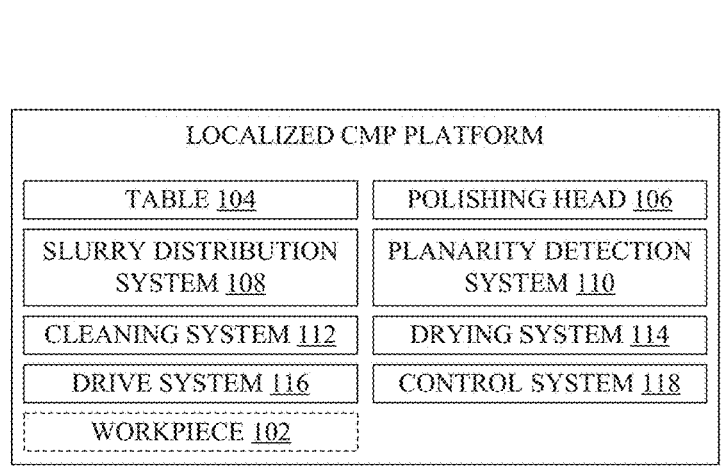
FIG. 1A illustrates a block diagram of some embodiments of a localized chemical mechanical polishing (CMP) platform for local profile control.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some chemical mechanical polishing (CMP) platforms, a platen is covered with a polishing pad and is configured to rotate the polishing pad. A polishing head is arranged over the polishing pad, and is configured to support and rotate a workpiece. The polishing head comprises concentric pressure zones configured to press corresponding concentric regions on a to-be-polished surface of the workpiece into the polishing pad with varying force. A slurry distribution system comprises one or more nozzles arranged over the polishing pad, and is configured to provide a slurry to the polishing pad through the nozzle(s). The slurry comprises chemical and abrasive components. Due to the pressing force and the slurry, the to-be-polished surface undergoes chemical and mechanical polishing. A conditioner is arranged over the polishing pad, and is configured to remove polishing debris from the polishing pad.

A challenge with the foregoing CMP platforms is that the CMP platforms are limited to concentric profile control. The profile of the workpiece can be controlled between different concentric regions of the workpiece, but not between different locations within a concentric region the workpiece. Therefore, while the foregoing CMP platforms may improve the planarity of the workpiece, the CMP platforms may be unable to fully planarize the workpiece, such that rough regions of hillocks and/or valleys may remain on the to-be-polished surface. Depending upon the size of the hillocks and/or the valleys, the workpiece may call for reworking. However, this reduces the wafers per hour (WPH) that the CMP platforms can process.

In view of the foregoing, the present application is directed towards a CMP platform for local profile control. The profile of a workpiece can be laterally controlled in two dimensions along a to-be-polished surface of the workpiece, relative to a reference feature that moves with the to-be-polished surface. In some embodiments, a table is configured to support and rotate the workpiece. A polishing pad is arranged over the table and comprises a width less than about half that of the workpiece. The polishing pad is configured to move laterally between rough regions of the workpiece, and is configured to individually press against and rotate on the rough regions. Cleaning and drying systems are respectively configured to clean and dry the workpiece in situ on the table after individually polishing the rough regions.

The CMP platform advantageously allows improved planarization with fewer hillocks and/or valleys. This, in turn, allows features to be more precisely formed. Further, the CMP platform advantageously allows cleaning and drying of the workpiece in situ without having to move the workpiece. This, in turn, improves throughput and workflow.

Even more, the CMP platform may advantageously be used downstream from a traditional CMP platform for fine polishing and/or reworking so as to avoid impacting the WPH of the traditional CMP platform.

With reference to FIG. 1A, a block diagram 100A of some embodiments of a localized CMP platform for local profile control is provided. The localized CMP platform is configured to planarize a to-be-polished surface of a workpiece 102, and advantageously allows the profile of the workpiece 102 to be laterally controlled in two dimensions, relative to a reference feature configured to move with the to-be-polished surface. The workpiece 102 may be, for example, a semiconductor wafer supporting electronic circuits under manufacture. The semiconductor wafer may be, for example, a 300 or 450 millimeter wafer.

A table 104 is configured to support the workpiece 102 with the to-be-polished surface facing up. In some embodiments, the table 104 is further configured to rotate the workpiece 102. A polishing head 106 is arranged over the table 104, and is configured to laterally move over the to-be-polished surface. Further, the polishing head 106 is configured to rotate, while being pressed against the to-be-polished surface. The polishing head 106 comprises a width substantially less than that of the table and/or the workpiece 102, such as a width of about a third, quarter or fifth of the table width or the workpiece width. A slurry distribution system 108 is configured to apply slurry between the workpiece 102 and the polishing head 106. The slurry comprises an abrasive component and a chemical component.

During use of the localized CMP platform, the table 104, the polishing head 106, and the slurry distribution system 108 coordinate to individually polish rough regions (i.e., regions with hillocks and/or valleys) on the to-be-polished surface, without polishing the entire to-be-polished surface. The polishing head 106 moves laterally between the rough regions and individually polishes the rough regions. Over a rough region, the polishing head 106 rotates and presses against the rough region, while the slurry distribution system 108 applies the slurry and, in some embodiments, the table rotates. Due to the pressing force and the abrasive components of the slurry, the rough region undergoes mechanical polishing. Further, due to the chemical components of the slurry, the rough region also undergoes chemical polishing.

Advantageously, individually polishing the rough regions allows improved planarity on the to-be-polished surface. Compared to global CMP or CMP with concentric profile control, fewer hillocks and/or valleys remain. This, in turn, advantageously allows more precise control over the dimensions of features of the electronic circuits under manufacture and may further allow reductions in the dimensions of the features.

In some embodiments, a planarity detection system 110 is configured to measure the planarity of the to-be-polished surface to identify locations of rough regions for polishing. The planarity detection system 110 may measure the planarity of the to-be-polished surface before, after, or in real time during polishing. Where the planarity detection system 110 measures the planarity of the to-be-polished surface in real time, the polishing may continue until no rough regions remain. The planarity detection system 110 may include, for example, one or more of one or more of an Eddy current sensor, a laser rangefinder, an ultrasonic rangefinder, a torque sensor, and a white light interferometry scanner.

A cleaning system 112 and a drying system 114 are configured to respectively clean and dry the workpiece in situ after polishing. In some embodiments, the cleaning system 112 includes one or more of a deionized water cleaning system, a fluid jet cleaning system, and a megasonic cleaning system. In some embodiments, the drying system 114 includes one or more of a spin drying system, a purge drying system, and an isopropyl alcohol (IPA) vapor drying system. Advantageously, the cleaning system 112 and the drying system 114 allow the workpiece 102 to be cleaned after polishing, without having to be moved, thereby improving throughput and increasing the WPH that can be processed.

A drive system 116 is configured to provide the mechanical force driving or otherwise moving the systems 108, 110, 112, 114 and/or the components 104, 106 of the localized CMP platform. For example, the drive system 116 may be configured to rotate the polishing head 106 and, in some embodiments, the table 104. As another, the drive system 116 may be configured to drive pumps of the cleaning system 112. The drive system 116 comprises one or more motors, such as rotary actuators, configured to generate the mechanical force.

A control system 118 is configured to coordinate and control the systems 108, 110, 112, 114, 116 and/or the components 104, 106 of the localized CMP platform to polish, clean, and dry the workpiece 102. For example, the control system 118 may be configured to receive planarity measurements from the planarity detection system 110 or an external planarity tool, to identify the locations of rough regions on the to-be-polished surface based on the planarity measurements, and to coordinate and control the systems 108, 110, 112, 114, 116 and/or the components 104, 106 to individually polish the rough regions.

Figure 1B:
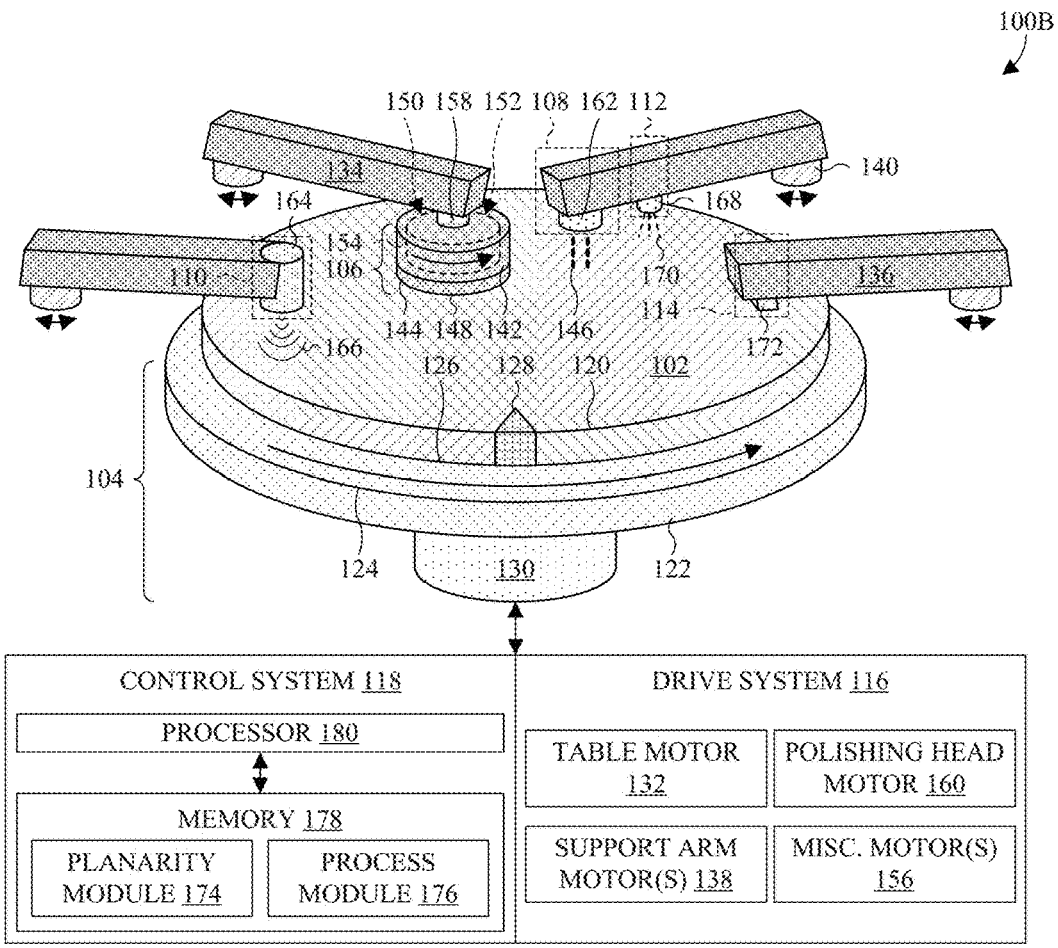
FIG. 1B illustrates a cross-sectional view of some embodiments of a localized CMP platform for local profile control.

With reference to FIG. 1B, a cross-sectional view 100B of some embodiments of the localized CMP platform is provided. A table 104 is configured to support a workpiece 102 with a to-be-polished surface 120 of the workpiece 102 facing up. The table 104 comprises a support region 122 with a substantially planar upper surface 124 configured to interface with a surface 126 of the workpiece 102 that is opposite the to-be-polished surface 120. The substantially planar upper surface 124 may be, for example, circular and/or have a width greater than that of the workpiece 102. In some embodiments, the table 104 further comprises a key feature 128 on the substantially planar upper surface 124 that is configured to fit within a notch of the workpiece 102. The key feature 128 and the notch advantageously align the table 104 and the workpiece 102, and provide a point of reference for localized CMP. The key feature 128 and the notch may be, for example, triangular in shape. In some embodiments, the table 104 further comprises a spindle region 130 coupling the support region 122 to a table motor 132 of a drive system 116. The table motor 132 is configured to rotate the table 104 about a spindle axis perpendicular to the substantially planar upper surface 124.

In some embodiments, one or more support arms 134, 136 are laterally spaced around the table 104. The support arm(s) 134, 136 extend laterally over the table 104, from adjacent to the table 104, and may be, for example, telescoping. Over the table 104, the support arm(s) 134, 136 support one or more corresponding components of the localized CMP platform. Adjacent to the table 104, the support arm(s) 134, 136 are anchored (e.g., to a housing of the localized CMP platform). Further, adjacent to the table 104, in some embodiments, one or more of the support arm(s) 134, 136 are coupled to one or more corresponding support arm motors 138 of the drive system 116, typically through one or more corresponding spindles 140. The support arm motor(s) 138 are configured to telescope the one or more of the support arm(s), and/or to rotate the one or more of the support arm(s) 134, 136 about one or more corresponding spindle axes perpendicular to the substantially planar upper surface 124 of the table 104.

A polishing head 106 is arranged over the table 104, and is configured to move over and polish the to-be-polished surface 120. The polishing head 106 comprises a pad holder 142 and a polishing pad 144 mounted to a lower side of the pad holder 142. The polishing pad 144 is abrasive and/or porous so as to receive abrasive components of slurry 146. The polishing pad 144 comprises a substantially planar lower surface 148 configured to press against and rotate on the to-be-polished surface 120. Further, the polishing pad 144 comprises a width that is substantially less than that of the table 104 and/or the workpiece 102 (e.g., less than about a third, quarter, fifth, sixth, seventh, or eighth of the table width or of the workpiece width).

In some embodiments, a variable-force element 150 is configured to exert a downward force on the polishing pad 144, and/or a variable-temperature element 152 is configured to control the temperature of the polishing pad 144. As appreciated by the skilled artisan, the downward force applied to the polishing pad 144 and the temperature of the polishing pad 144 both influence the polishing rate of the polishing head 106. The variable-force element 150 and/or the variable-temperature element 152 may comprise, for example, a fluid-filled bladder 154 arranged in the polishing holder 142, over the polishing pad 144. The pressure of the fluid-filled bladder 154 controls the downward force applied to the polishing pad 144, and may be controlled by, for example, a pump driven by a motor 156 of the drive system 116. The temperature of the fluid in the fluid-filled bladder 154 controls the temperature of the polishing pad 144, and may be controlled by, for example, a resistive heater. Alternatively, the variable-force element 150 may be implemented by, for example, a motor 156 of the drive system 116 or the like configured to directly apply force to the polishing pad 144, and/or the variable-temperature element 152 may be implemented by, for example, a resistive heater or the like configured to directly apply heat to the polishing pad 144.

A spindle 158 couples the polishing head 106 to a polishing head motor 160 of the drive system 116 that is configured to rotate the polishing head 106 about a spindle axis perpendicular to the substantially planar upper surface 124 of the table 104. Further, in some embodiments, the spindle 158 couples the polishing head 106 to one of the support arm(s) 134, 136. The one of the support arm(s) 134, 136 may be, for example, configured to move the polishing head 106 across the to-be-polished surface 120. Further, the one of the support arm(s) 134, 136 may be configured to, for example, apply the downward force to the polishing pad 144.

A slurry distribution system 108 is configured to provide the slurry 146 to an interface between the polishing pad 144 and the workpiece 102. The slurry 146 comprises chemical and abrasive components. In some embodiments, the slurry 146 comprises silica ($SiO_2$) or alumina ($Al_2O_3$). The slurry distribution system 108 comprises one or more nozzles 162 arranged over the table 104. The nozzle(s) 162 are configured to spray the slurry 146 on the to-be-polished surface 120. In some embodiments, the nozzle(s) 162 are coupled to one of the support arm(s) 134, 136. The one of the support arm(s) 134, 136 may be, for example, configured to hold the nozzle(s) 162 at a fixed location. Alternatively, the one of the support arm(s) 134, 136 may be, for example, configured to move the nozzle(s) 162 across the workpiece 102 and/or in unison with the polishing head 106.

During use of the localized CMP platform, the table 104, the polishing head 106, and the slurry distribution system 108 coordinate to polish rough regions (i.e., regions with hillocks and/or valleys) on the to-be-polished surface 120. The polishing head 106 moves laterally in two dimensions between the rough regions, relative to a reference feature moving with the to-be-polished surface 120, such as the key feature 128 and/or a feature patterned on the workpiece 102. In some embodiments, while the table 104 remains fixed (i.e., does not rotate), the polishing head 106 moves laterally in two dimensions of a Cartesian coordinate system to the rough regions. For example, the polishing head 106 may laterally scan over the to-be-polished surface 120 of the workpiece 102 and stop over the rough regions. In other embodiments, while the table 104 rotates, the polishing head 106 moves laterally in two dimensions of a polar coordinate system to the rough regions. For example, the polishing head 106 may scan radially, relative to the center of rotation of the table 104, and stop over the rotational paths of the rough regions. The polishing head 106 may be moved radially by rotating a support arm 134 supporting the polishing head 106.

Over a rough region, the polishing head 106 rotates and presses against the rough region, while the slurry distribution system 108 applies the slurry 146. Due to the pressing force on the polishing pad 144 and the abrasive components of the slurry 146, the rough region undergoes mechanical polishing. Further, due to the chemical components of the slurry 146, the rough region also undergoes chemical polishing.

In some embodiments, a planarity detection system 110 is configured to measure the planarity of the to-be-polished surface 120, so locations of rough regions (i.e., regions of hillocks and/or valleys) on the to-be-polished surface 120 can be identified. The planarity detection system 110 comprises one or more planarity sensors 164 arranged over the table 104. In some embodiments, the planarity sensor(s) 164 are mounted to the polishing head 106. In other embodiments, the planarity sensor(s) 164 are mounted to one of the support arm(s) 134, 136.

The planarity sensor(s) 164 may correspond to, for example, one or more of an Eddy current sensor, a laser rangefinder, an ultrasonic rangefinder (as illustrated), a torque sensor, and a white light interferometry scanner. The Eddy current sensor is configured to induce Eddy currents on the to-be-polished surface 120, and to measure the magnitudes of the induced Eddy currents, while moving over the workpiece 102. The magnitudes of the Eddy currents are proportional to the vertical distance between the Eddy current sensor and the to-be-polished surface 120, and therefore describe the planarity of the to-be-polished surface 120. The torque sensor is configured to measure the torque applied by the drive system 116 while rotating the polishing head 106 and moving the polishing head 106 over the workpiece 102. The torque is proportional to the amount of friction between the polishing pad 144 and the to-be-polished surface 120. A higher torque generally corresponds to a rougher surface, whereas lesser torque generally corresponds to a smoother surface. Therefore, the torque describes the planarity on the to-be-polished surface 120. The white light interferometry scanner is configured to measure the surface profile on the to-be-polished surface 120 using interferometry and white light while moving over the workpiece 102. The laser and ultrasonic rangefinders are configured to measure the vertical distance between the rangefinder and the to-be-polished surface 120 respectively using laser pulses and ultrasonic pulses 166 while moving over the workpiece 102.

A cleaning system 112 is configured to clean off polishing debris from the to-be-polished surface 120 in situ, typically after individually polishing the rough regions. The cleaning system 112 comprises one or more cleaning elements 168 arranged over the table 104. In some embodiments, the cleaning element(s) 168 are mounted to one of the support arm(s) 134, 136. For example, the cleaning element(s) 168 may be mounted to the same support arm as the nozzle(s) 162 of the slurry distribution system 108. Further, in some embodiments, the cleaning element(s) 168 correspond to one or more nozzles (as illustrated), such as fluid jets, and/or one or more megasonic transducers.

The nozzle(s) are configured to spray the to-be-polished surface 120 with corresponding fluids 170. The nozzle(s) may be, for example, configured to spray the to-be-polished surface 120 with a liquid, such as deionized water, and/or a gas, such as nitrogen gas. Further, the nozzle(s) may be, for example, configured to spray the to-be-polished surface 120 at a high pressure greater than about 10 pounds per square inch (psi), such as about 30-100 psi or more than about 100 psi. The megasonic transducer(s) are configured to induce cavitation on the to-be-polished surface 120 to loosen and remove polishing debris. The megasonic transducer(s) may, for example, direct ultrasonic waves in the frequency range of about 0.8-2.0 megahertz towards the to-be-polished surface 120.

A drying system 114 is configured to dry the workpiece 102 in situ, typically after cleaning. In some embodiments, the drying system 114 is configured to spin dry the workpiece 102 by rotating the workpiece 102 at an elevated speed so centrifugal force removes liquid (e.g., deionized water) on the workpiece 102. In such embodiments, the drying system 114 comprises the table motor 132 of the drive system 116. In some embodiments, the drying system 114 is configured to dry the workpiece 102 by applying one or more fluids to the workpiece 102 through one or more nozzles 172 arranged over workpiece 102. In some embodiments, the nozzle(s) 172 are mounted to one of the support arm(s) 134, 136.

Where the drying system 114 is configured to dry the workpiece 102 through application of the fluid(s) to the workpiece 102, the drying system 114 may, for example, be configured to purge dry the workpiece 102 by blowing an inert gas, such as nitrogen gas, and/or clean dry air (CDA) towards the to-be-polished surface 120, through the nozzle(s) 172. The CDA may, for example, be less than about 1 part per million (ppm) of carbon dioxide and less than about 0.003 ppm of hydrocarbon vapor. Further, the CDA may, for example, have a moisture content below about a −100 degrees Fahrenheit (° F.) dew point or a moisture content below about a −40° F. dew point. As another example, the drying system 114 may be configured to IPA vapor dry the workpiece 102 by applying IPA vapor and deionized water to the workpiece 102 through the nozzle(s) 172.

A control system 118 is electrically coupled to the systems 108, 110, 112, 114, 116 and/or the components 104, 106 of the localized CMP platform. The control system 118 is configured to coordinate and control the systems 108, 110, 112, 114, 116 and/or the components 104, 106 to polish, clean, and dry the workpiece 102. The control system 118 comprises a planarity module 174 configured to identify the locations of rough regions on the to-be-polished surface 120 using planarity measurements (e.g., from the planarity detection system 110). Further, the control system 118 comprises a process module 176 configured to coordinate polishing of rough regions on the to-be-polished surface 120 based on the identified locations of the rough regions, to clean the workpiece 102 in situ, and to dry the workpiece 102 in situ.

The control system 118 is implemented by hardware and, in some embodiments, software configured to carry out the foregoing functionality. For example, the control system 118 may include a field-programmable gate array (FPGA) or some other circuit. Further, to the extent that the control system 118 includes software, the control system 118 includes at least one memory 178 storing the software and at least one processor 180 configured to execute the software. For example, the control system 118 may include a microcontroller, a microprocessor, or an application-specific integrated circuit (ASIC) configured to execute the software from the at least one memory 178. In some embodiments (as illustrated), the software includes the planarity module 174 and/or the process module 176.

The localized CMP platform was described and illustrated with a substantially horizontal orientation. The substantially planar upper surface 124 of the table 104 was substantially horizontal, and the support arm(s) 134, 136 were laterally spaced around the table 104. In alternative embodiments, the localized CMP platform may have a substantially vertical orientation. The substantially planar upper surface 124 of the table 104 may be substantially vertical and the support arm(s) 134, 136 may be vertically spaced around the table 104.

Figure 2A:
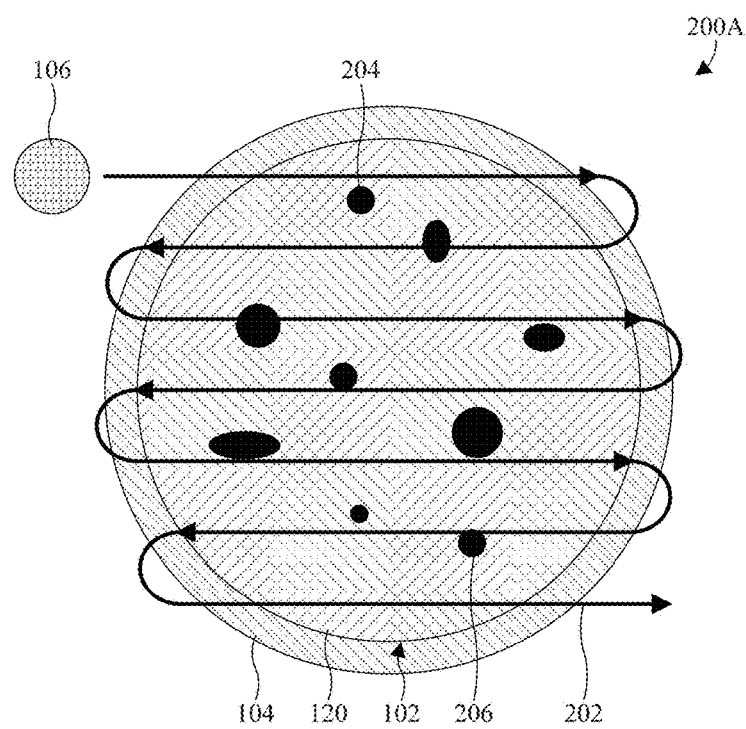
FIG. 2A illustrates some embodiments of a path traversed by a polishing heading during localized CMP.

With reference to FIG. 2A, a top view 200A of some embodiments of a path 202 that the polishing head 106 may take to rough regions 204, 206 of a workpiece 102 is provided. The polishing head 106 is moved while the table 104 is fixed, and is moved laterally in two dimensions of a Cartesian coordinate system. The polishing head 106 may be, for example, moved by a support arm supporting the polishing head 106 over the workpiece 102. The support arm 134 may move the polishing head 106 by, for example, telescoping and/or rotating about a spindle axis of a corresponding spindle anchoring the support arm 134.

At each rough region 204, 206 on a to-be-polished surface 120 of the workpiece 102, the polishing head 106 is pressed and rotated against the rough region 204, 206 to individually polish the rough region 204, 206. Polishing may, for example, be carried out for a predetermined period of time or until the torque applied to rotate the polishing head 106 falls below a predetermined threshold. As described above, torque is lesser for smoother surfaces and greater for rougher surfaces. The torque may be sensed using, for example, a torque sensor of a planarity detection system. Upon completing the polishing of a rough region 204, 206, the polishing head 106 continues along the path 202 to the next rough region 204, 206.

Figure 2B:
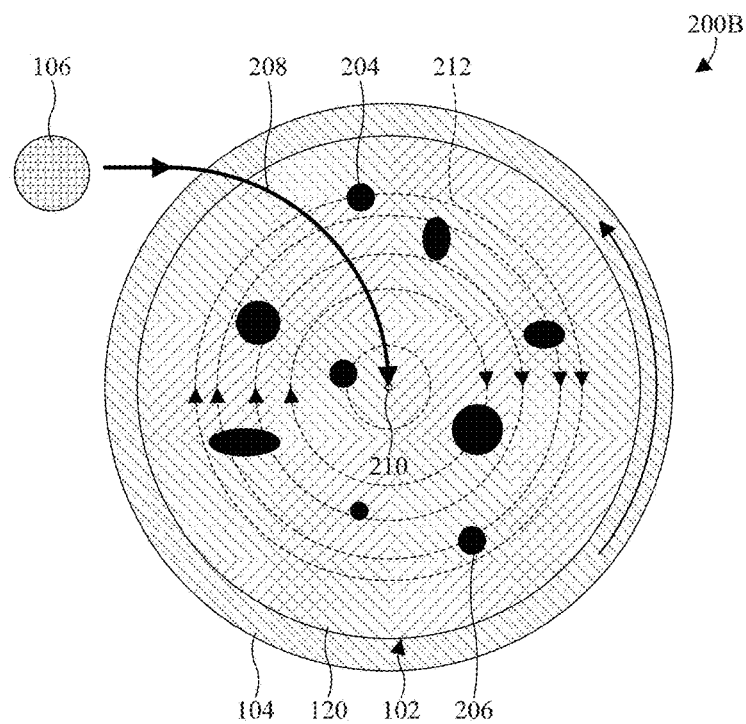
FIG. 2B illustrates other embodiments of a path traversed by a polishing head during localized CMP.

With reference to FIG. 2B, a top view 200B of other embodiments of a path 208 that the polishing head 106 may take to rough regions 204, 206 of a workpiece 102 is provided. The path 208 is arcuate and extends from laterally adjacent to the table 104 to an axis 210 about which the table 104 is rotated. As such, the polishing head 106 is moved radially relative to the axis 210, and laterally in two dimensions of a polar coordinate system, relative to a reference feature that moves with the workpiece 102 (e.g., a notch or a pattern feature). The polishing head 106 may be, for example, moved by a support arm 134 (see FIG. 1B) supporting the polishing head 106 over the workpiece 102.

At each rotational path 212 of a rough region 204, 206 on a to-be-polished surface 120, the polishing head 106 is pressed and rotated against the rough region 204, 206 when it passes under the polishing head 106 to individually polish the rough region 204, 206. Polishing may, for example, be carried out for a predetermined period of time or until on the torque applied to rotate the polishing head 106 falls below a predetermined threshold. Upon completing the polishing of a rough region 204, 206, the polishing head 106 continues along the path 208 to the next rotational path 212.

Figure 3:
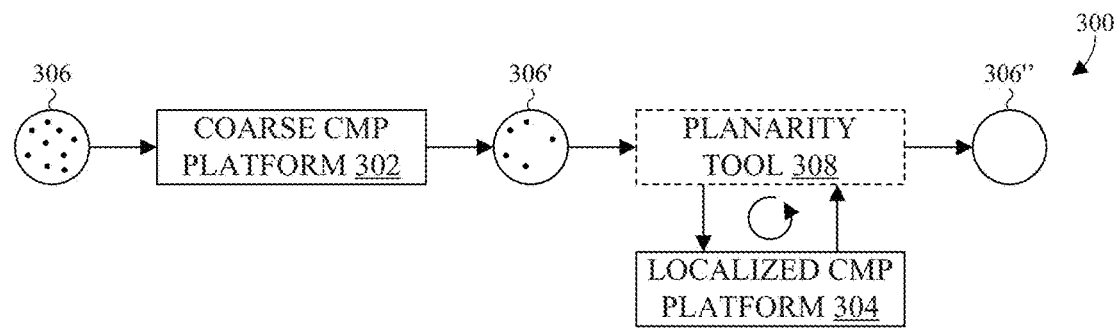
FIG. 3 illustrates a cross-sectional view of some embodiments of a CMP system with a localized CMP platform and a coarse CMP platform.

With reference to FIG. 3, a cross-sectional view 300 of some embodiments of a CMP system is provided. The CMP system includes a coarse CMP platform 302 and a localized CMP platform 304. The coarse CMP platform 302 is configured to coarsely planarize a to-be-polished surface of a workpiece 306, and is restricted to global profile control or lateral profile control in a single dimension, relative to a reference feature that moves with the workpiece 306. For example, concentric profile control is restricted to lateral profile control in a single dimension (i.e., the radial dimension of a polar coordinate system). The localized CMP platform 304 is configured to locally planarize a to-be-polished surface of a workpiece 306', and advantageously allows lateral profile control in two dimensions. The localized CMP platform 304 may be as described above in connection with FIGS. 1A & B.

During use of the CMP system, the coarse CMP platform 302 is applied to a workpiece 306, and the localized CMP platform 304 is subsequently applied to the coarsely planarized workpiece 306', to achieve a substantially planar workpiece 306". Advantageously, by performing the localized planarization after the coarse planarization, the localized planarization minimally impacts the throughput of the coarse CMP platform 302.

In some embodiments, a planarity tool 308 independent of the localized CMP platform 304 is associated with the localized CMP platform 304. The planarity tool 308 is configured to measure the planarity of a to-be-polished surface of a workpiece 306', so the locations of rough regions (i.e., regions with hillocks and/or valleys) on the to-be-polished surface can be identified. The planarity tool 308 may, for example, measure the planarity of the workpiece 306' using Eddy currents, torque measurements of a polishing head, reflection times of laser pulses or ultrasonic pulses, or white light interferometry.

During use of the CMP system, in some embodiments, the planarity tool 308 measures the planarity of the coarsely planarized workpiece 306' before localized planarization, but after coarse planarization. In such embodiments, the localized planarization may be omitted if the planarity of the coarsely planarized workpiece 306' meets predetermined criteria. For example, the localized planarization may be omitted if the coarsely planarized workpiece 306' has less than a predetermined number of rough regions. Further, the planarity measurements may be used for local planarization if the planarity of the coarsely planarized workpiece 306' fails the predetermined criteria. Also, during use of the CMP system, in some embodiments, the planarity tool 308 measures the planarity of the locally planarized workpiece 306" after local planarization. In such embodiments, the localized planarization may be repeated until the predetermined criteria are not met. Further, the planarity measurements may be used for any repeated localized planarization.

Figure 4:
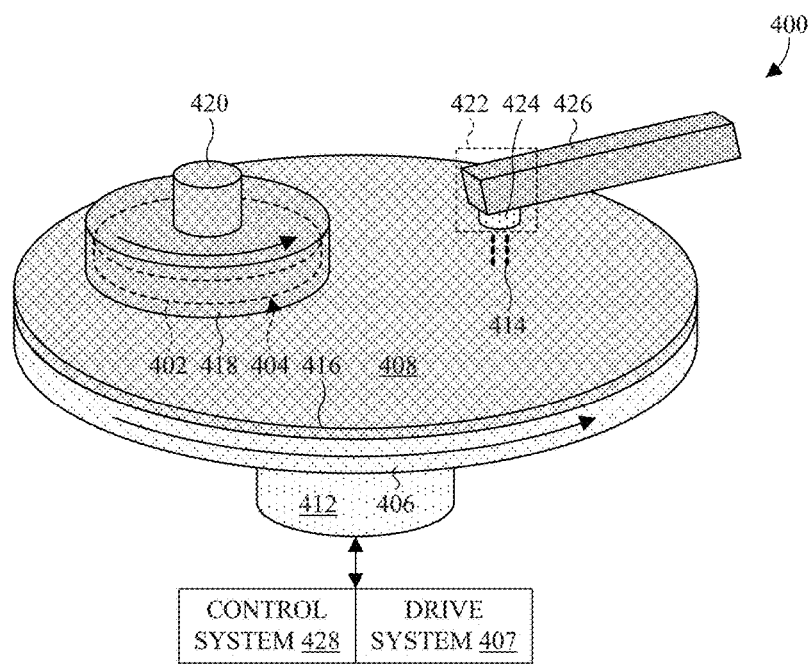
FIG. 4 illustrates a cross-sectional view of some embodiments of a coarse CMP platform.

With reference to FIG. 4, a cross-sectional view 400 of some embodiments of a coarse CMP platform is provided. The coarse CMP platform is configured to planarize a to-be-polished surface 402 of a workpiece 404, and is restricted to global profile control or lateral profile control in one dimension, relative to a reference feature that moves with the workpiece 404. The coarse CMP platform may be, for example, used within the CMP system of FIG. 3.

A platen 406 supports a polishing pad 408 and is configured to rotate the polishing pad 408. The platen 406 may be, for example, circular and/or have a width substantially larger than that of the workpiece 404 (e.g., 2 or 3 times as large). The platen 406 is coupled to a motor of a drive system 407 through a corresponding spindle 412. The motor is configured to rotate the platen 406 about a spindle axis perpendicular to an upper surface of the platen 406.

The polishing pad 408 is arranged on the platen 406, and is configured to polish the to-be-polished surface 402. The polishing pad 408 is abrasive and/or porous so as to receive abrasive components of slurry 414. The polishing pad 408 comprises a substantially planar upper surface 416 configured to interface with the to-be-polished surface 402 of the workpiece 404, and a width that is substantially equal to that of the platen 406.

A polishing head 418 is arranged over the polishing pad 408, and is configured to carry and rotate the workpiece 404 within a cavity on a lower side of the polishing head 418. The polishing head 418 is coupled to a motor of the drive system 407 through a spindle 420. The motor is configured to rotate the polishing head 418 about a spindle axis perpendicular to the substantially planar upper surface 416 of the polishing pad 408. The polishing head 418 comprises a width that is substantially less than that of the polishing pad 408 (e.g., less than about half of the polish head width).

A slurry distribution system 422 is configured to provide the slurry 414 to the polishing pad 408. The slurry 414 comprises chemical and abrasive components. The slurry distribution system 422 comprises one or more nozzles 424 arranged over the polishing pad 408. The nozzles 424 are configured to spray the slurry 414 on the polishing pad 408, such that the slurry 414 interfaces with the to-be-polished surface 402. In some embodiments, the nozzles 424 are coupled a support arm 426 anchored laterally adjacent to the polishing pad 408.

During use of the coarse CMP platform, the platen 406, the polishing head 418, and the slurry distribution system 422 coordinate to polish the to-be-polished surface. The polishing head 418 rotates and presses the to-be-polished surface against the polishing pad 408, while the polishing pad 408 rotates and the slurry distribution system 422 applies the slurry 414 to the polishing pad 408. Due to the pressing force and the abrasive components of the slurry 414, the to-be-polished surface undergoes mechanical polishing. Further, due to the chemical components of the slurry 414, the to-be-polished surface also undergoes chemical polishing.

A control system 428 is configured to coordinate and control the systems 407, 422 and/or the components 410, 418 of the coarse CMP platform to polish the workpiece 404. The control system 428 is implemented by hardware and, in some embodiments, software configured to carry out the foregoing functionality. Further, to the extent that the control system 428 includes software, the control system 428 includes at least one memory storing the software and at least one processor configured to execute the software.

Figure 5:
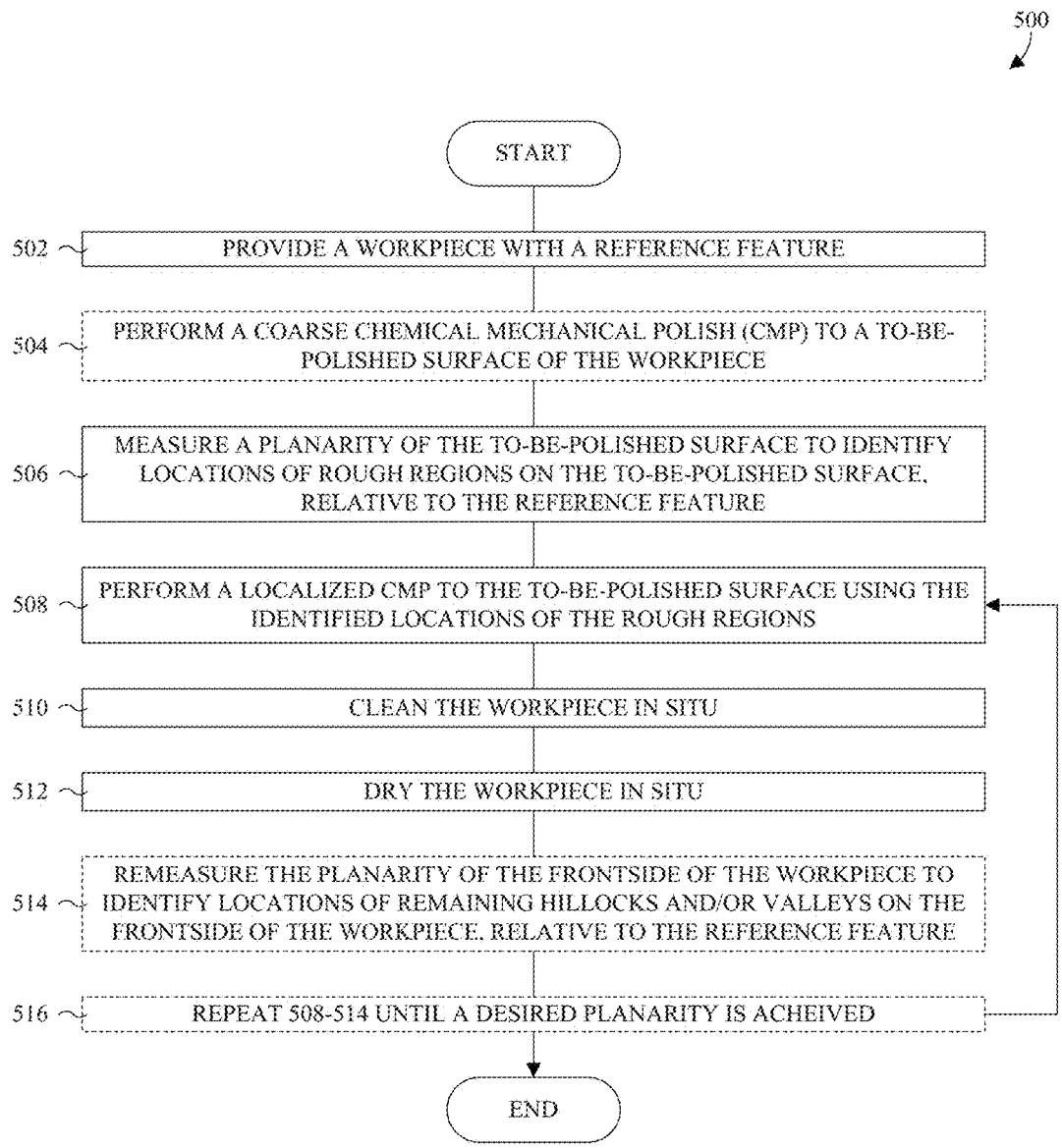
FIG. 5 illustrates a flowchart of some embodiments of a method for planarizing a surface of a workpiece using localized CMP.

With reference to FIG. 5, a flowchart 500 provides some embodiments of a method for planarizing a to-be-polished surface of a workpiece using localized CMP.

At 502, a workpiece comprising a reference feature is provided. The workpiece may be, for example, a semiconductor wafer supporting electronic circuits under manufacture. The reference feature may be, for example, a notch on the side of the workpiece or a feature patterned into a layer of the workpiece.

At 504, in some embodiments, a coarse CMP is performed to a to-be-polished surface of the workpiece. The coarse CMP is restricted to global profile control or lateral profile control in one dimension, such as concentric profile control. For example, for global profile control, every location on the to-be-polished surface may be subject to the same level of polishing. As another example, for local profile control, profile control may be restricted to the radial dimension in a polar coordinate system. The coarse CMP may be performed by, for example, the coarse CMP platform of FIG. 4.

At 506, the planarity of the to-be-polished surface is measured to identify locations of rough regions (i.e., locations of hillocks and/or valleys) on the to-be-polished surface, relative to the reference feature. The planarity of the to-be-polished surface may, for example, be measured by an Eddy current sensor, a laser rangefinder, an ultrasonic rangefinder, a torque sensor, or a white light interferometry scanner that is scanned over the to-be-polished surface. Further, the planarity of the to-be-polished surface may, for example, be measured before, or in real time during, the subsequent act.

At 508, a localized CMP is performed to the to-be-polished surface using the identified locations of the rough regions. The rough regions are then individually polished. The localized CMP may be performed by, for example, the localized CMP platform of FIGS. 1A & B. Advantageously, individually polishing the rough regions allows improved planarity on the to-be-polished surface. This, in turn, advantageously allows more precise control over the dimensions of features of the electronic circuits under manufacture and may further allow reductions in the dimensions of the features.

At 510 and 512, the workpiece is respectively cleaned and dried in situ (i.e., without moving it after the localized CMP). The cleaning may be, for example, performed with a deionized water rinse, a high pressure spray, or megasonic cavitation. The drying may be, for example, performed with a spin dry, a purge dry, or an IPA vapor dry. The cleaning and the drying may be performed by, for example, the localized CMP platform of FIGS. 1A & B. Advantageously, performing the cleaning and the drying in place improves throughput and increases the WPH that can be processed.

At 514, in some embodiments, the planarity of the to-be-polished surface is remeasured to identify locations of rough regions, relative to the reference feature, on the to-be-polished surface.

At 516, in some embodiments, 508-514 are repeated until the planarity of the to-be-polished surface meets predetermined criteria. For example, 508-514 may be repeated until the number of rough regions on the to-be-polished surface is zero or otherwise less than predetermined number.

While the disclosed method (e.g., the method described by the flowchart 500) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6-12, cross-sectional and top views of some embodiments of structures illustrating the acts of the method of FIG. 5. Although the structures of FIGS. 6-12 are described in relation to the method, it will be appreciated that the structures are not limited to the method, but instead may stand alone. Similarly, although the method is described in relation to the structures of FIGS. 6-12, it will be appreciated that the method is not limited to structures, but instead may stand alone.

Figure 6:
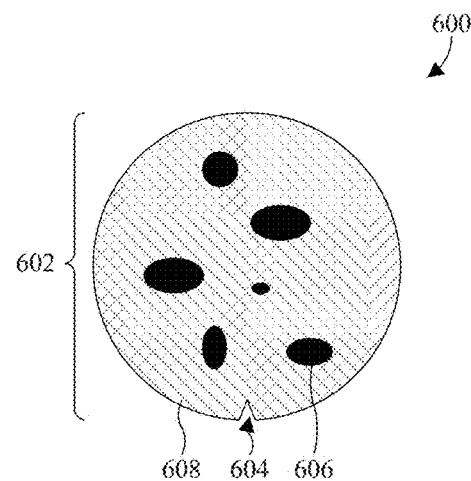
FIGS. 6-12 illustrate a series of top and cross-sectional views of some embodiments of structures illustrating the method of FIG. 5 at various stages.

FIG. 6 illustrates a top view 600 of some embodiments corresponding to Act 502. As illustrated, a workpiece 602 is provided. The workpiece 602 comprises a side notch 604 configured for use as a reference feature (i.e., a point of reference during localized CMP). Further, the workpiece 602 comprises rough regions 606 (i.e., regions of hillocks and/or valleys) spread across a to-be-polished surface 608 of the workpiece 602.

Figure 7:
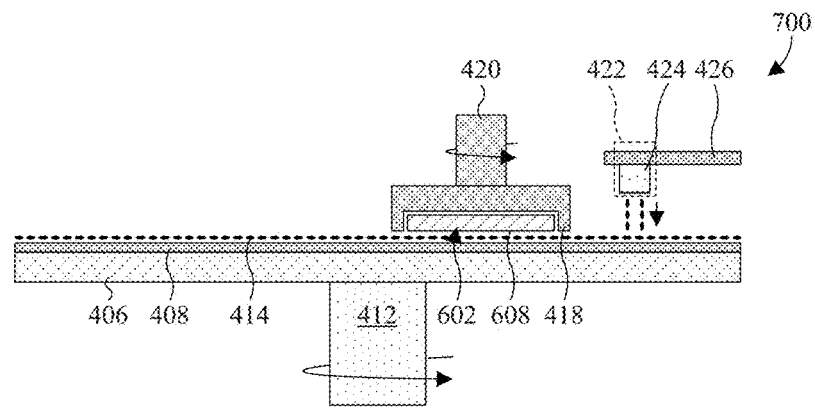

FIG. 7 illustrates a cross-sectional view 700 of some embodiments corresponding to Act 504. As illustrated, a coarse CMP is performed on the to-be-polished surface 608. The workpiece 602 is arranged in a polishing head 418 with the to-be-polished surface 608 of the facing down, and rotated about an axis of a spindle 420 coupling the polishing head 418 to a motor. Further, the to-be-polished surface 608 is pressed against a polishing pad 408. The polishing pad 408 is arranged over a platen 406 and rotated about an axis of a spindle 412 coupling the platen 406 to a motor.

Concurrent with the dual rotation of the polishing pad 408 and the workpiece 602, a slurry distribution system 422 provides slurry 414 to the polishing pad 408 through a nozzle 424 suspended over the polishing pad 408 by a support arm 426. The slurry 414 comprises abrasive and chemical components. Due to the pressing force against the workpiece 602 and the abrasive components, the workpiece 602 undergoes mechanical polishing. Due to the chemical components, the workpiece 602 undergoes chemical polishing.

Figure 8:
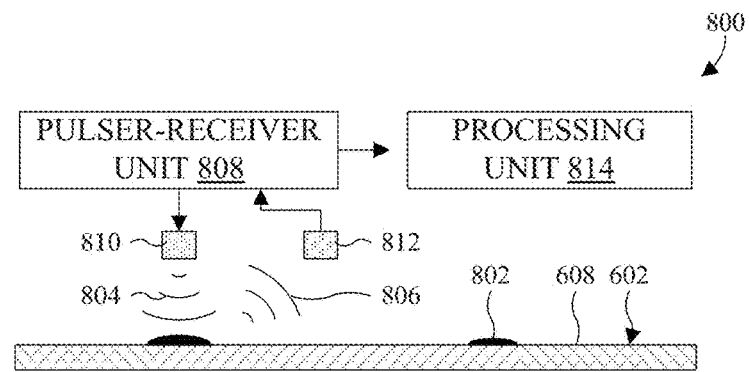

FIG. 8 illustrates a cross-sectional view 800 of some embodiments corresponding to Act 506. As illustrated, the planarity of the to-be-polished surface 608 is measured to identify rough regions 802 on the to-be-polished surface 608. The planarity may, for example, be measured by a planarity detection system of a localized CMP platform or by an external planarity tool. Further, the planarity may, for example, be measured using Eddy currents, laser pulses, ultrasonic pulses 804, 806 (as illustrated), or white light interferometry.

In some embodiments in which ultrasonic pulses 804, 806 are employed to measure the planarity of the to-be-polished surface 608, a pulser-receiver unit 808 transmits ultrasonic pulses 804 towards the to-be-polished surface 608 with a transmitting ultrasonic transducer 810, while being scanned across the to-be-polished surface 608. Further, the pulser-receiver unit 808 receives ultrasonic pulses 804, 806, including reflections 806 of the transmitted ultrasonic pulses 804 off the to-be-polished surface 608, through a receiving ultrasonic transducer 812.

A processing unit 814 receives data describing the temporal relationship between the transmitted ultrasonic pulses 804 and the reflected ultrasonic pulses 806 from the pulser-receiver unit 808. Further, based on the time for the transmitted ultrasonic pulses 804 to reflect back from the to-be-polished surface 608, the processing unit 814 determines vertical distances between the ultrasonic transducers 810, 812 and the to-be-polished surface 608. Vertical distances from across the to-be-polished surface 608 are then combined to describe the planarity (i.e., the surface profile) of the to-be-polished surface 608.

Figure 9:
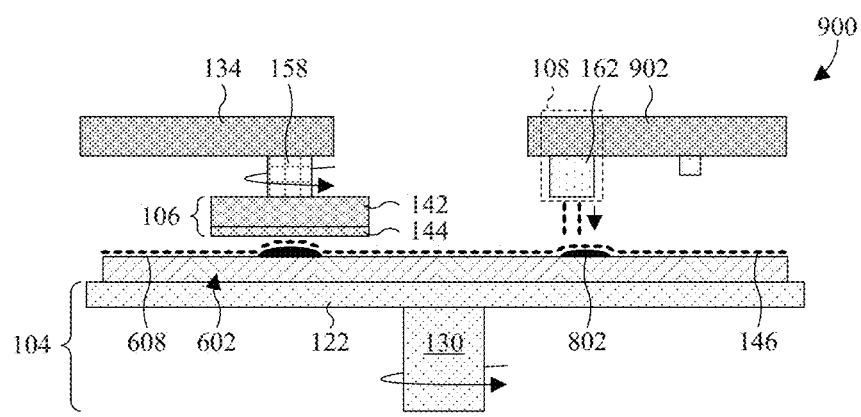

FIG. 9 illustrates a cross-sectional view 900 of some embodiments corresponding to Act 508. As illustrated, localized CMP is performed on the to-be-polished surface 608 of the workpiece 602. The workpiece 602 is arranged on a support region 122 of a table 104 with the to-be-polished surface 608 facing up, and rotated about an axis of a spindle region 130 of the table 104 coupling the support region 122 to a motor. Further, a polishing head 106 is arranged over the workpiece 602 and scanned laterally over the workpiece 602 to locations of rough regions 802 on the to-be-polished surface 608. In some embodiments, the polishing head 106 is scanned in two dimensions (relative to a reference feature) by a first support arm 134 supporting the polishing head 106 over the workpiece 602. Over a rough region 802, a polishing pad 144 of the polishing head 106 is pressed and rotated against the rough region 802. The polishing pad 144 is mounted to a pad holder 142 of the polishing head 106 and rotated about an axis of a spindle 158 coupling the polishing head 106 to a motor.

Concurrent with the dual rotation of the polishing pad 144 and the workpiece 602, a slurry distribution system 108 provides slurry 146 to the workpiece 602 through a nozzle 162 suspended over the workpiece 602 by a second support arm 902. The slurry 146 comprises abrasive and chemical components. Due to the pressing force against the workpiece 602 and the abrasive components, the workpiece 602 undergoes mechanical polishing. Due to the chemical components, the workpiece 602 undergoes chemical polishing.

Figure 10:
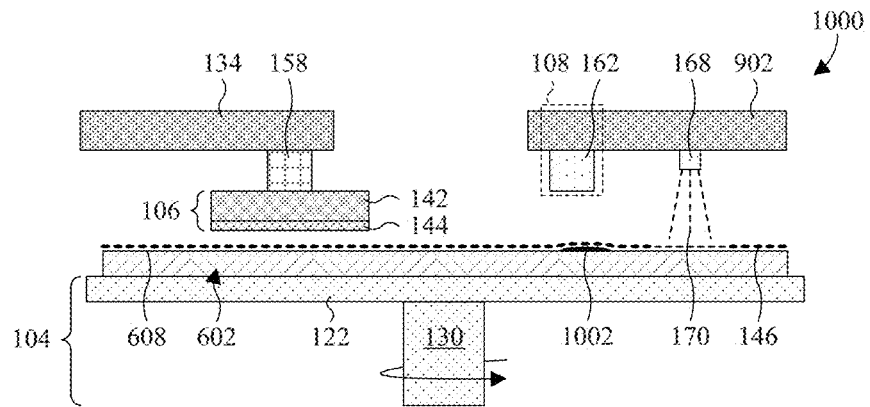

FIG. 10 illustrates a cross-sectional view 1000 of some embodiments corresponding to Act 510. As illustrated, the workpiece 602 is cleaned in situ to remove polishing debris and the slurry 146, and to expose remaining rough regions 1002. In some embodiments, the workpiece 602 is cleaned by spraying the workpiece 602 with fluid 170, such as deionized water or some other fluid, while being rotated. The fluid 170 may be, for example, sprayed through a nozzle suspended over the workpiece 602 by the second support arm 902.

Figure 11:
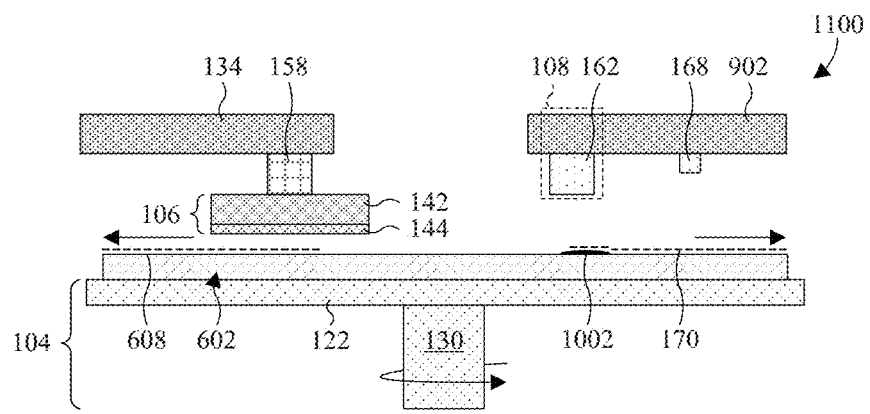

FIG. 11 illustrates a cross-sectional view 1100 of some embodiments corresponding to Act 512. As illustrated, the workpiece 602 is dried in situ. In some embodiments, the workpiece 602 is dried by spin drying in which the workpiece 602 is rotated at an elevated speed so that centrifugal force removes fluid 170 on the workpiece 602. In other embodiments, the workpiece 602 is cleaned by purge dry or IPA vapor dry.

Figure 12:
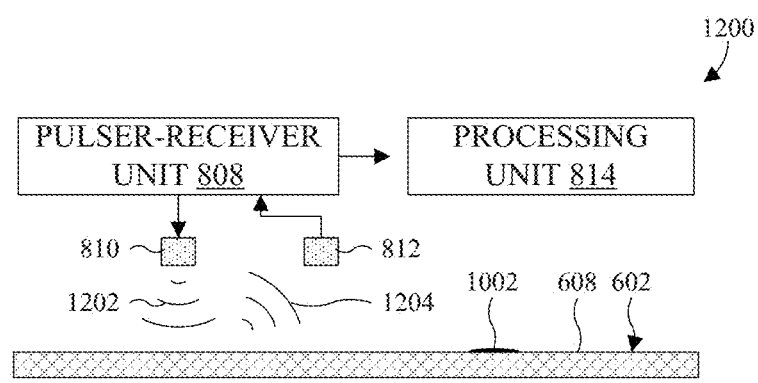

FIG. 12 illustrates a cross-sectional view 1200 of some embodiments corresponding to Act 514. As illustrated, the planarity of the to-be-polished surface 608 is remeasured to identify rough regions 1002 on the to-be-polished surface 608. The planarity may, for example, be measured by a planarity detection system of a localized CMP platform or by an external planarity tool. Further, the planarity may, for example, be measured using Eddy currents, laser pulses, ultrasonic pulses 1202, 1204 (as illustrated), or white light interferometry.

Thus, as can be appreciated from above, the present disclosure provides a localized CMP. A table is configured to support a workpiece with a to-be-polished surface. A polishing pad is spaced from the table with a width less than about half that of the table. The polishing pad is configured to individually polish rough regions of hillocks or valleys on the to-be-polished surface. A slurry distribution system is configured to apply slurry to an interface between the polishing pad and the workpiece. A cleaning system is configured to clean the workpiece in situ on the table. A drying system is configured to dry the workpiece in situ on the table.

In other embodiments, the present disclosure provides a method for CMP with local profile control. A planarity of a to-be-polished surface of a workpiece is measured to identify rough regions on the to-be-polished surface. The rough regions are individually polished by pressing and rotating a polishing pad against the rough regions and applying slurry to interfaces between the polishing pad and the rough regions. The polishing pad has a width less than about half that of the workpiece. The workpiece is cleaned in situ without moving the workpiece after polishing. The workpiece is dried in situ without moving the workpiece after cleaning.

In yet other embodiments, the present disclosure provides a CMP system with localized profile control. A first CMP platform is configured to perform an initial polishing on a workpiece. A second CMP platform is configured to individually polish rough regions of the workpiece after the initial polishing. The second CMP platform further comprises cleaning and drying systems respectively configured to clean and dry the workpiece in situ after individually polishing the rough regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for chemical mechanical polishing (CMP) with local profile control, the method comprising:
   providing a workpiece having a to-be-polished surface, wherein the to-be-polished surface comprises a ring-shaped region, wherein the ring-shaped region comprises a first hillock and a second hillock circumferentially spaced, and wherein the ring-shaped region is smooth from the first hillock to the second hillock;
   measuring a planarity of the to-be-polished surface of the workpiece to identify rough regions on the to-be-polished surface;
   individually polishing the rough regions by pressing and rotating a polishing pad against the rough regions and applying slurry to interfaces between the polishing pad and the rough regions, wherein the polishing pad has a width less than about half that of the workpiece, wherein the individual polishing of the rough regions comprises pressing the polishing head against the to-be-polished surface at the first and second hillocks while releasing pressure against the to-be-polished surface where smooth;
   after the individual polishing, cleaning the workpiece in situ without moving the workpiece from its location during the individual polishing; and
   after the cleaning, drying the workpiece in situ without moving the workpiece from its location during the individual polishing and the cleaning.

2. The method according to claim 1, further comprising:
initially polishing the to-be-polished surface of the workpiece before measuring the planarity of the to-be-polished surface.

3. The method according to claim 2, wherein initially polishing the to-be-polished surface comprises:
performing a CMP process in which every location on the to-be-polished surface is subject to a common level of polishing.

4. The method according to claim 1, wherein individually polishing the rough regions comprises:
controlling a temperature of the polishing pad to control a polishing rate of the polishing pad.

5. The method according to claim 1, wherein individually polishing the rough regions comprises:
moving the polishing pad between the rough regions in two dimensions of a Cartesian coordinate system, relative to a reference feature on a table supporting the workpiece.

6. The method according to claim 1, wherein individually polishing the rough regions comprises:
moving the polishing pad between the rough regions in two dimension of a polar coordinate system, relative to a reference feature on a table supporting the workpiece.

7. The method according to claim 1, wherein measuring a planarity of a to-be-polished surface comprises:
determining distances between the to-be-polished surface and a sensor while the sensor is scanned across the to-be-polished surface.

8. The method according to claim 1, wherein cleaning the workpiece comprises:
focusing energy or a fluid towards to the to-be-polished surface.

9. The method according to claim 1, wherein drying the workpiece comprises:
applying a fluid to the to-be-polished surface.

10. A method for chemical mechanical polishing (CMP) with local profile control, the method comprising:
performing a coarse CMP to a surface of a workpiece by a coarse CMP platform, wherein the performing of the coarse CMP comprises loading the workpiece into a polishing head and pressing the surface against a first polishing pad with the polishing head, and wherein the first polishing pad has a width greater than that of the workpiece;
after the coarse CMP, measuring a planarity of the surface to identify rough regions of the surface, wherein the surface comprises a first hillock and a second hillock upon conclusion of the coarse CMP, and wherein the first and second hillocks are spaced by a substantially planar surface region of the surface;
performing a localized CMP to the surface of the workpiece by a local CMP platform, wherein the performing of the localized CMP comprises individually polishing the rough regions by pressing and rotating a second polishing pad against the rough regions and applying slurry to interfaces between the second polishing pad and the rough regions, wherein the second polishing pad has a width less than about half that of the workpiece, wherein the local CMP platform is independent of the coarse CMP platform, wherein the performing of the localized CMP comprises applying pressure to the surface at the first and second hillocks by pressing the second polishing pad against the first and second hillocks, and wherein the performing of the localized CMP further comprises releasing the pressure at the substantially planar surface region;
after the performing of the localized CMP, cleaning the workpiece in situ without moving the workpiece from its location during the localized CMP; and
drying the workpiece in situ without moving the workpiece from its location during the localized CMP and the cleaning.

11. The method according to claim 10, wherein the performing of the localized CMP comprises:
controlling a temperature of the second polishing pad to control a polishing rate of the second polishing pad.

12. The method according to claim 10, wherein the performing of the localized CMP comprises:
moving the second polishing pad between the rough regions in two dimensions of a Cartesian coordinate system, relative to a reference feature on a table supporting the workpiece.

13. The method according to claim 12, wherein the rough regions comprises a first rough region and a second rough region, and wherein the first and second rough regions are at different locations in each of the two dimensions.

14. The method according to claim 10, wherein the measuring comprises:
determining distances between the surface of the workpiece and a sensor while the sensor is scanned laterally across the surface.

15. The method according to claim 10, wherein the cleaning comprises focusing energy or a fluid towards to the surface of the workpiece, and wherein the drying comprises applying a fluid to the surface.

16. The method according to claim 10, wherein the localized CMP does not polish smooth regions on the surface of the workpiece that are between the rough regions of the surface.

17. A method for chemical mechanical polishing (CMP), the method comprising:
performing a first CMP to a wafer surface of a wafer, wherein the wafer surface is substantially planar upon conclusion of the first CMP, wherein the wafer surface comprises a first non-planar feature and a second non-planar feature upon conclusion of the first CMP, and wherein the first and second non-planar features are spaced by a substantially planar surface region of the wafer surface;
analyzing the wafer surface to detect the first and second non-planar features of the wafer surface;
performing a second CMP to the wafer surface of the wafer, wherein the performing of the second CMP comprises:
providing a polishing pad comprising a pad surface, wherein the pad surface has a surface area smaller than a surface area of the wafer surface;
applying pressure to the first non-planar feature by pressing the pad surface against the first non-planar feature;
rotating the pad surface about a pad axis to locally planarize the first non-planar feature without performing localized planarization of the substantially planar surface region between the first and second non-planar features, wherein the pad axis is substantially perpendicular to the wafer surface;
moving the polishing pad to the second non-planar feature over the substantially planar surface region while maintaining contact of the polishing pad with the substantially planar surface region; and
while moving the polishing pad to the second non-planar feature, releasing the pressure;

after the performing of the second CMP, cleaning the workpiece in situ without moving the workpiece from its location during the second CMP; and drying the workpiece in situ without moving the workpiece from its location during the second CMP and the cleaning.

18. The method according to claim 17, wherein the performing of the second CMP comprises:

controlling a temperature of the polishing pad to control a polishing rate of the polishing pad.

19. The method according to claim 17, wherein the analyzing comprises:

repeatedly measuring a distance from the wafer surface of the wafer to a sensor overlying the wafer surface while the sensor is scanned laterally across the wafer surface.

20. The method according to claim 17, wherein the cleaning comprises focusing energy or a fluid towards to the wafer surface of the wafer, and wherein the drying comprises applying a fluid to the wafer surface.

* * * * *